(12) United States Patent
Oda et al.

(10) Patent No.: US 8,172,960 B2
(45) Date of Patent: *May 8, 2012

(54) TANTALUM SPUTTERING TARGET AND METHOD OF MANUFACTURING SAME

(75) Inventors: Kunihiro Oda, Ibaraki (JP); Atsushi Hukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 1049 days.

This patent is subject to a terminal disclaimer.

(21) Appl. No.: 10/551,732

(22) PCT Filed: Feb. 19, 2004

(86) PCT No.: PCT/JP2004/001915
§ 371 (c)(1),
(2), (4) Date: Oct. 3, 2005

(87) PCT Pub. No.: WO2004/090193
PCT Pub. Date: Oct. 21, 2004

(65) Prior Publication Data
US 2007/0102288 A1    May 10, 2007

(30) Foreign Application Priority Data
Apr. 1, 2003  (JP) .................. 2003-097659

(51) Int. Cl.
C22C 27/02    (2006.01)
C22F 1/18     (2006.01)

(52) U.S. Cl. ........................ 148/422; 148/668

(58) Field of Classification Search .................. 148/668, 148/422; 204/298.12
See application file for complete search history.

(56) References Cited

U.S. PATENT DOCUMENTS

| | | | |
|---|---|---|---|
| 4,994,118 A * | 2/1991 | Pircher et al. | 148/541 |
| 6,193,821 B1 * | 2/2001 | Zhang | 148/668 |
| 6,197,134 B1 | 3/2001 | Kanzaki et al. | |
| 6,323,055 B1 | 11/2001 | Rosenberg et al. | |
| 6,331,233 B1 | 12/2001 | Turner | |
| 6,348,113 B1 | 2/2002 | Michaluk et al. | |
| 6,348,139 B1 | 2/2002 | Shah et al. | |
| 6,759,143 B2 | 7/2004 | Oda et al. | |
| 6,770,154 B2 | 8/2004 | Koenigsmann et al. | |
| 6,893,513 B2 | 5/2005 | Michaluk et al. | |
| 7,156,963 B2 | 1/2007 | Oda | |
| 2001/0054457 A1 * | 12/2001 | Segal et al. | 148/438 |
| 2002/0063056 A1 | 5/2002 | Shah et al. | |
| 2005/0268999 A1 | 12/2005 | Oda | |
| 2007/0023281 A1 | 2/2007 | Oda | |
| 2007/0062806 A1 | 3/2007 | Oda | |
| 2007/0062807 A1 | 3/2007 | Oda | |

FOREIGN PATENT DOCUMENTS

| | | |
|---|---|---|
| EP | 0902102 A1 | 3/1999 |
| JP | 06-264232 A | 9/1994 |
| JP | 09-104972 A | 4/1997 |
| JP | 2002-363662 A | 12/2002 |
| JP | 2002-363736 A | 12/2002 |
| WO | WO 0031310 A1 * | 6/2000 |

OTHER PUBLICATIONS

Christopher A. Michaluk et al., "Tantalum 101: Economics and Technology of Ta Materials", Semiconductor International, vol. 23, No. 8, pp. 271-278, Jul. 2000.
English Abstract of JP 2001-271161 A, Oct. 2, 2001.
English Abstract of JP 2000-323433 A, Nov. 24, 2000.
English Abstract of JP 2000-239835 A, Sep. 5, 2000.
English Abstract of JP 2000-323434 A, Nov. 24, 2000.
English Abstract of JP 01-215426 A, Aug. 29, 1989.
English Abstract of JP 61-124566 A, Jun. 12, 1986.
English Abstract of JP 2004-027358 A, Jan. 29, 2004.
Unpublished Co-pending U.S. Appl. No. 11/912,450.

* cited by examiner

Primary Examiner — Roy King
Assistant Examiner — Caitlin Kiechle
(74) Attorney, Agent, or Firm — Howson & Howson LLP

(57) ABSTRACT

Provided is a tantalum sputtering target manufactured by working a molten and cast tantalum ingot or billet through forging, annealing and rolling, wherein the structure of the tantalum target comprises a non-recrystallized structure. The tantalum sputtering target having a high deposition speed and excellent uniformity of film, producing less arcings and particles and having excellent film forming properties, and the method capable of stably manufacturing the target can be provided by improving and devising plastic working steps such as forging and rolling, and the heat treatment step.

23 Claims, 3 Drawing Sheets

TANTALUM SPUTTERING TARGET AND METHOD OF MANUFACTURING SAME

BACKGROUND OF THE INVENTION

The present invention relates to a manufacturing method of a sputtering target by subjecting a molten and cast tantalum ingot or billet to processes such as forging, annealing and rolling, and to a tantalum sputtering target obtained thereby.

In recent years, the sputtering method for forming a film of materials such as metal or ceramics has been used in numerous fields such as electronics, corrosion resistant materials and ornaments, catalysts, as well as in the manufacture of cutting/grinding materials and abrasion resistant materials.

Although the sputtering method itself is a well-known method in the foregoing fields, recently, particularly in the electronics field, a tantalum sputtering target suitable for forming films of complex shapes and forming circuits is in demand.

Generally, this tantalum target is manufactured by forging and annealing (heat treatment) an ingot or billet formed by performing electron beam melting and casting to a tantalum material, and thereafter performing rolling and finish processing (mechanical processing, polishing, etc.) thereto.

In this kind of manufacturing procedure, the forging performed to the ingot or billet for the manufacture thereof will destroy the cast structure, disperse or eliminate the pores and segregations, and, by further annealing this, recrystallization will occur, and the precision and strength of the structure can be improved to a certain degree.

For example, the tantalum raw material is subject to electronic beam melting and thereafter cast to prepare an ingot or billet, and subsequently subject to cold forging—recrystallization annealing at 1173K—cold forging—recrystallization annealing at 1173K—cold rolling—recrystallization annealing at 1173K—finish processing to form a target material. In this manufacturing process of a tantalum target, the molten and cast ingot or billet generally has a crystal grain diameter of 50 mm or more.

As a result of subjecting the ingot or billet to hot forging and recrystallization annealing, the cast structure is destroyed, and generally even and fine (100 μm or less) crystal grains can be obtained. Nevertheless, there is a problem in that hetero-phase crystal grains assembled in a form of wrinkles will appear in a part of the target structure after this recrystallization annealing; in particular, a pattern in the form of wrinkles or streaks is formed from the center to the peripheral edge of the target.

When examining the reason such hetero-phase crystal grains assembled in a form of wrinkles are generated in the manufacturing process of conventional technology, even when hot forging and the subsequent recrystallization annealing are performed, primary crystal grains (roughly 50 mm) in the ingot or billet remain, and recrystallized grains will be generated in the primary crystal grains at a recrystallization temperature of merely 1173K (900° C.).

In other words, forging causes the primary crystal grains to be crushed, and, although it appears that they all disappear, at the subsequent recrystallization temperature of roughly 1173K, it is considered that the destruction of the primary crystals is incomplete, and some traces of primary crystals remain. This will not disappear even with the subsequent forging and recrystallization annealing, and it is considered that hetero-phase crystal grains assembled in a form of wrinkles are generated at the stage of the final finish processing.

Since the existence of irregular crystal grains in the target that are generated during forging, rolling or the annealing to be performed thereafter will change the sputtering rate, and there is a problem in that evenness (uniformity) of the film will be affected, generation of arcings and particles will be promoted, and the quality of sputtered deposition may deteriorate thereby. Therefore, it is necessary to suppress the generation of the foregoing hetero-phase as much as possible.

And, when performing sputtering, since it is said that the finer and more uniform the recrystallized structure of the target, and more uniform the crystal orientation thereof, a more uniform deposition is possible, and a film generating few arcings and particles and having stable characteristics can be obtained. Thus, measures for making the recrystallized structure fine and uniform, and arranging it to be in a specific crystal orientation are being taken (e.g., refer to Publication of Translation of International Application No. 2002-518593, U.S. Pat. No. 6,331,233).

When observing the mechanism of recrystallization, generally speaking, a recrystallized structure is an aggregate of individual crystals with respectively different plane orientations, and each crystal is divided by a grain boundary. Before rearrangement occurs, the strain added to the object via plastic working such as cold rolling is absorbed in the primary crystals by the transgranular slip in a certain direction, and the strain is accumulated therein.

Such strained primary crystals take on a network cell structure that is extremely fine with slightly different orientations aggregated with lattice defects such as transition, and are also separated into a plurality of different areas with significantly differing orientations. When this kind of deformation structure is heated, the cells change into subgrains (recovery process) through the combination of transition or rearrangement. The change from a cell into a subgrain hardly involves any change in the measurement. And, it is considered that these subgrains are combined, and a specific subgrain grows to become a recrystallized core, corrodes the non-recrystallized portion, grows and promotes the recrystallization.

As described above, with a tantalum target, it is said that a fully recrystallized structure based on full annealing is favorable in stabilizing the structure.

Nevertheless, with the recrystallization annealing (full annealing) based on a high temperature and to be performed for a long period of time, there is a problem in that the crystal grain size will become coarsened, and the average crystal grain size would ordinarily be 100 μm or more.

When sputtering is performed with a tantalum target having such a coarse recrystallized structure, there are problems in that the evenness (uniformity) of the film will become inferior, the generation of arcings and particles will be promoted, and the quality of sputtering deposition will deteriorate.

SUMMARY OF THE INVENTION

In order to overcome the foregoing problems, an object of the present invention is to provide a tantalum sputtering target having a high deposition speed and excellent uniformity of film, producing less arcings and particles and having excellent film forming properties, and the method capable of stably manufacturing the target by improving and devising plastic working steps such as forging and rolling, and the heat treatment step.

The present invention provides:
1. A tantalum sputtering target manufactured by subjecting a molten and cast tantalum ingot or billet to plastic working such as forging, annealing and rolling, wherein the structure of the tantalum target comprises a non-recrystallized structure;

2. The tantalum sputtering target according to paragraph 1 above, wherein the non-recrystallized structure is 20% or more;

3. The tantalum sputtering target according to paragraph 1 above, wherein the non-recrystallized structure is 40% or more;

4. The tantalum sputtering target according to any one of paragraphs 1 to 3 above, wherein the tantalum target has a Vickers hardness of 90 or more;

5. The tantalum sputtering target according to any one of paragraphs 1 to 3 above, wherein the tantalum target has a Vickers hardness of 100 or more; and 6. The tantalum sputtering target according to any one of paragraphs 1 to 3 above, wherein the tantalum target has a Vickers hardness of 125 or more.

The present invention also provides:

7. A manufacturing method of a tantalum sputtering target comprising a non-recrystallized structure by subjecting a molten and cast tantalum ingot or billet to processes such as forging, annealing and rolling, wherein plastic working is ultimately performed thereto;

8. A manufacturing method of a tantalum sputtering target comprising a non-recrystallized structure by subjecting a molten and cast tantalum ingot or billet to processes such as forging, annealing and rolling, wherein, after the ultimate plastic working process, this is further subject to annealing at a temperature of 1173K or less;

9. The manufacturing method of a tantalum sputtering target according to paragraph 7 or paragraph 8 above, wherein, after the ultimate plastic working process or after the annealing process, finish processing is performed to form a target shape;

10. The manufacturing method of a tantalum sputtering target according to any one of paragraphs 7 to 9 above, wherein, during the processing stage, forging and recrystallization annealing are repeated two or more times;

11. The manufacturing method of a tantalum sputtering target according to any one of paragraphs 7 to 10 above, wherein extend forging and upset forging are repeatedly performed; and 12. The manufacturing method of a tantalum sputtering target according to any one of paragraphs 7 to 11 above, wherein, after forging ingot or billet, during the processing stage, recrystallization annealing is performed at a temperature between the recrystallization temperature and 1673K.

DETAILED DESCRIPTION OF THE INVENTION

Figure 1:
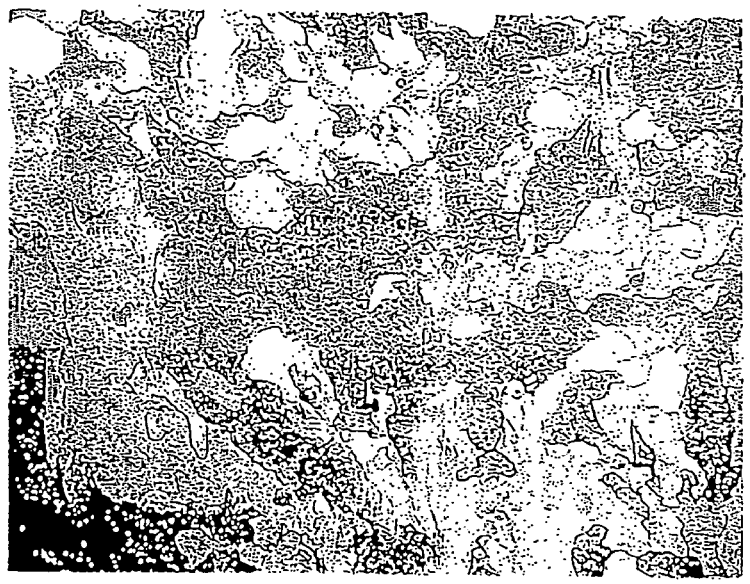
FIG. 1 is a micrograph (magnification×100) showing the structure of the tantalum target obtained by performing the cold finishing and stress relief annealing of the present invention.

The sputtering target of the present invention is manufactured with the following process. To exemplify a specific example, foremost, a tantalum raw material (usually, high purity tantalum of 4N5N or more is used) is melted via electronic beam melting or the like, and this is cast to prepare an ingot or billet. Next, this ingot or billet is subject to a series of processing steps including cold forging, rolling, annealing (heat treatment), finish processing and so on.

Specifically, for instance, the foregoing ingot or billet subject to cold forging—recrystallization annealing at a temperature of 1373K to 1673K—cold forging—recrystallization annealing at a temperature of 1373K to 1673K—cold forging—recrystallization annealing at a temperature between the recrystallization starting temperature and 1373K—cold (hot) rolling—annealing at a temperature of 1373K or less—finish processing to form a target material.

In the foregoing process, although the recrystallization annealing step at a temperature of 1373K to 1673K may be performed only once, by repeating this twice, the structural defects can be effectively reduced.

Although the manufacturing process is approximately the same as the conventional technology, what is especially important in the present invention is to obtain a target material ultimately subject to plastic working such as cold rolling, or to refrain from conducting sufficient recrystallization so as to leave the processed structure after the final processing step. Thereafter, this is ultimately finished in a target shape via finish processing such as machining or polishing.

The forging or rolling performed to the ingot or billet will destroy the cast structure, disperse or eliminate the pores and segregations, and, by further annealing this, recrystallization will occur, and the precision and strength of the structure can be improved to a certain degree by repeating clod forging or cold rolling and recrystallization annealing.

Thus, during the series of processes, it is necessary to destroy the cast structure with forging and rolling, and to sufficiently perform recrystallization. In the present invention also, after performing the processes of forging and rolling to the molten and cast tantalum ingot or billet, it is desirable to perform recrystallization annealing at a temperature between the recrystallization starting temperature and 1673K so as to make the structure fine and uniform. In other words, prior to the final process, the improvement of material characteristics is sought by making the structure fine and uniform pursuant to the recrystallization similar to conventional methods.

In the present invention, it is desirable to obtain a material ultimately subject to plastic working such as cold rolling as described above, or to perform annealing at a temperature of 1173K or less after the final plastic working process such as rolling. When performing such annealing, there is an effect of alleviating the warping or deformation of the target. This is thereafter subject to finish processing (machining or the like) so as to form a target shape.

The structure obtained thereby is a non-recrystallized structure, and a processed structure remains therein. The structure (annealed at 1073K) having the non-recrystallized structure of the present invention is shown in FIG. 1 (magnification×100) and FIG. 2 (magnification×50). Further, a conventional recrystallized structure (subject to recrystallization annealing at 1373K) is shown in FIG. 3 (magnification×100) and FIG. 4 (magnification×50). As shown in the drawings, the structure of the tantalum target according to the present invention is clearly different from the conventional recrystallized structure.

Although recrystallization will not occur under the foregoing temperature conditions for annealing, it is considered that the structure during the stage midway to recrystallization;

that is, during the subgrain (recovery process) stage, occurs due to the heat from the annealing performed at roughly 1073K.

With these subgrains, the strain added to the object is absorbed in the primary crystals by the transgranular slip in a certain direction, the strain is accumulated therein, and the subgrains have a structure before the crystal growth separated into different regions in slightly different directions divided with a plurality of transitions in this strained primary crystal.

Although it is difficult to measure the crystal grain size of the non-recrystallized structure obtained in the present invention, it involves a unique structure having subgrains that is clearly different from a recrystallized structure.

Further, a target finished with plastic working such as rolling without being subject to annealing generates strain due to the heat from the sputtering operation depending on the processing conditions, and warping (bending) or cracks may occur. Still, if significant strain is not generated, it may be used as a target as a matter of course.

When there is a possibility of the strain becoming great, it is desirable to perform the foregoing annealing. This target material will have a Vickers hardness of 90 or more, Vickers hardness of 100 or more, or Vickers hardness of 125 or more, and a target superior in strength can be obtained.

As a result of the foregoing processes, a tantalum target without any wrinkle-shaped defects, and without any generation of coarsened crystal grains that often arise due to annealing at high temperatures can be obtained. Although materials finished with rolling will have a rolling structure, this kind of structure will not influence the deposition structure.

What is most important in the present invention is not to perform sufficient recrystallization after the final process, but to yield an effect of improving the uniformity merely by leaving the processed structure therein. Since this kind of structure can be realized merely by changing the final heat treatment process, it is applicable to any improved versions heretofore and there will be no increase of costs.

In order to improve the uniformity characteristics of a sputtering target manufactured with a standard process, it is necessary to develop an improved version involving the increase of costs resulting from the change in the heat treatment temperature, number of times heat treatment is to be performed, or the number of times forging is to be performed. With the present invention, however, effects comparable to the development of improved versions can be realized, without increasing the costs, merely by making the non-recrystallized structure at the final step of a general manufacturing method. Needless to say, making the final step in the development of the improved versions a non-recrystallized structure will realize a further improvement effect.

The tantalum sputtering target of the present invention has a characteristic non-recrystallized structure obtained from the foregoing manufacturing process.

EXAMPLES AND COMPARATIVE EXAMPLES

The present invention is now explained in detail with reference to the Examples. These Examples are merely illustrative, and the present invention shall in no way be limited thereby. In other words, the present invention shall only be limited by the scope of claim for a patent, and shall include the various modifications other than the Examples of this invention.

Example 1

A tantalum raw material having a purity of 99.997% was subject to electron beam melting, and this was cast to prepare an ingot or billet having a thickness of 200 mm and diameter of 200 mmφ. The crystal grain diameter in this case was approximately 55 mm. Next, after performing extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ obtained.

Next, this was subject to extend forging and upset forging at room temperature once again, and recrystallization annealing was performed thereto again at a temperature of 1480K. As a result, a material having a structure in which the average crystal grain diameter is 100 μm, thickness of 100 mm, and diameter of 100 mm φ was obtained.

Next, this was subject to cold extend forging and upset forging, and recrystallization annealing at 1173K, subsequently subject to cold rolling once again, and recrystallization annealing at 1073K (800° C.) thereafter as well as finish processing, so as to obtain a target material having a thickness of 10 mm and diameter of 320 mm φ.

As a result of performing the foregoing process, it was possible to obtain a tantalum target having a non-recrystallized structure of roughly 80% and which has a Vickers hardness Hv of 130 to 171 (Vickers hardness Hv was measured at 20 points in the thickness direction of the target; hereinafter the same).

Figure 2:
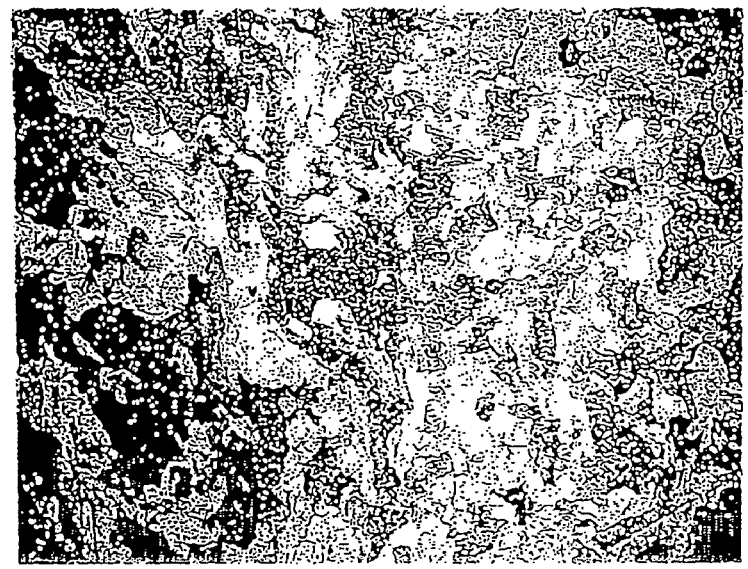
FIG. 2 is a micrograph (magnification×50) showing the structure of the foregoing tantalum target.
Figure 3:
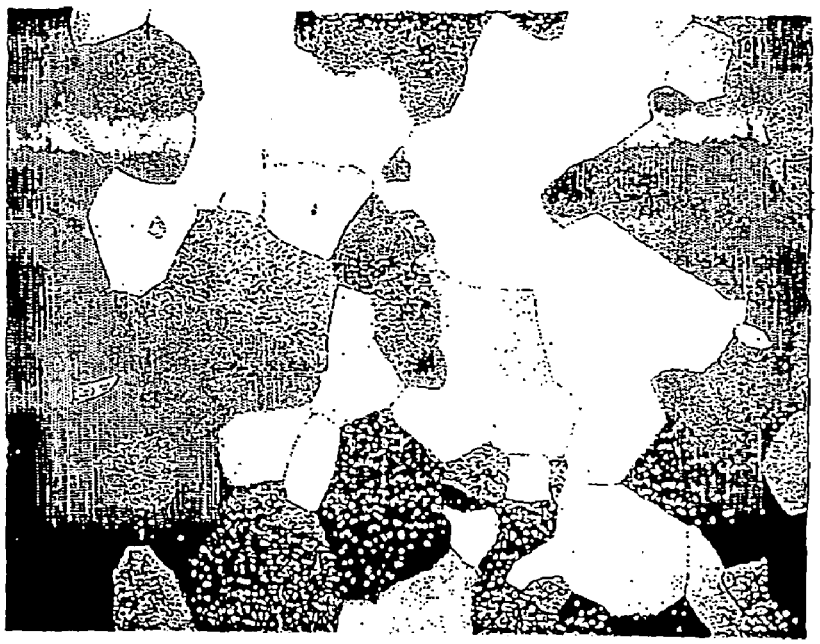
FIG. 3 is a micrograph (magnification×100) showing the structure of the tantalum target obtained by performing conventional forging and recrystallization annealing.

Further, the micrograph of this tantalum target obtained in Example 1 had the same crystal structure as the tantalum target shown in FIG. 1 and FIG. 2. The results are shown in Table 1.

Figure 4:
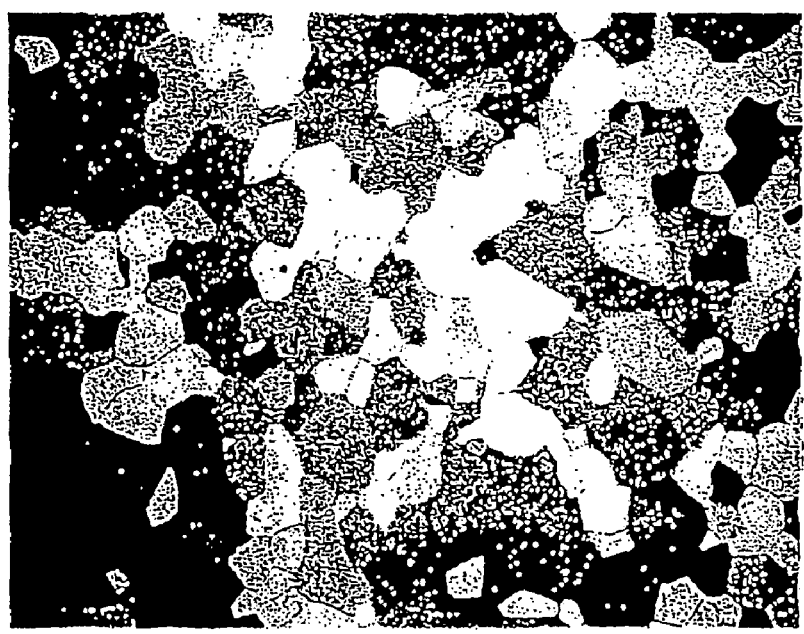
FIG. 4 is a micrograph (magnification×50) showing the structure of the foregoing tantalum target.

The non-recrystallized structure referred to in this Description is a structure in which the grain boundary is unclear, or a structure where the grain boundary is twisting in a curved line, or both, as represented in FIG. 1 and FIG. 2, and the percentage (%) is defined by subtracting the area ratio of the obvious recrystallized portion as represented in FIG. 3 and FIG. 4 from 100%.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

As evident from Table 1, in Example 1, variation in the resistance distribution within the sheet from the initial stage of sputtering to the final stage of sputtering was small (3.1 to 3.3%); that is, variation in the film thickness distribution was small.

As described above, the tantalum target of Example 1 has a high deposition speed, favorable film uniformity, little variation in the film thickness with an 8-inch wafer, and no generation of arcings or particles, and was therefore capable of improving the quality of sputtering deposition.

Figure 5:
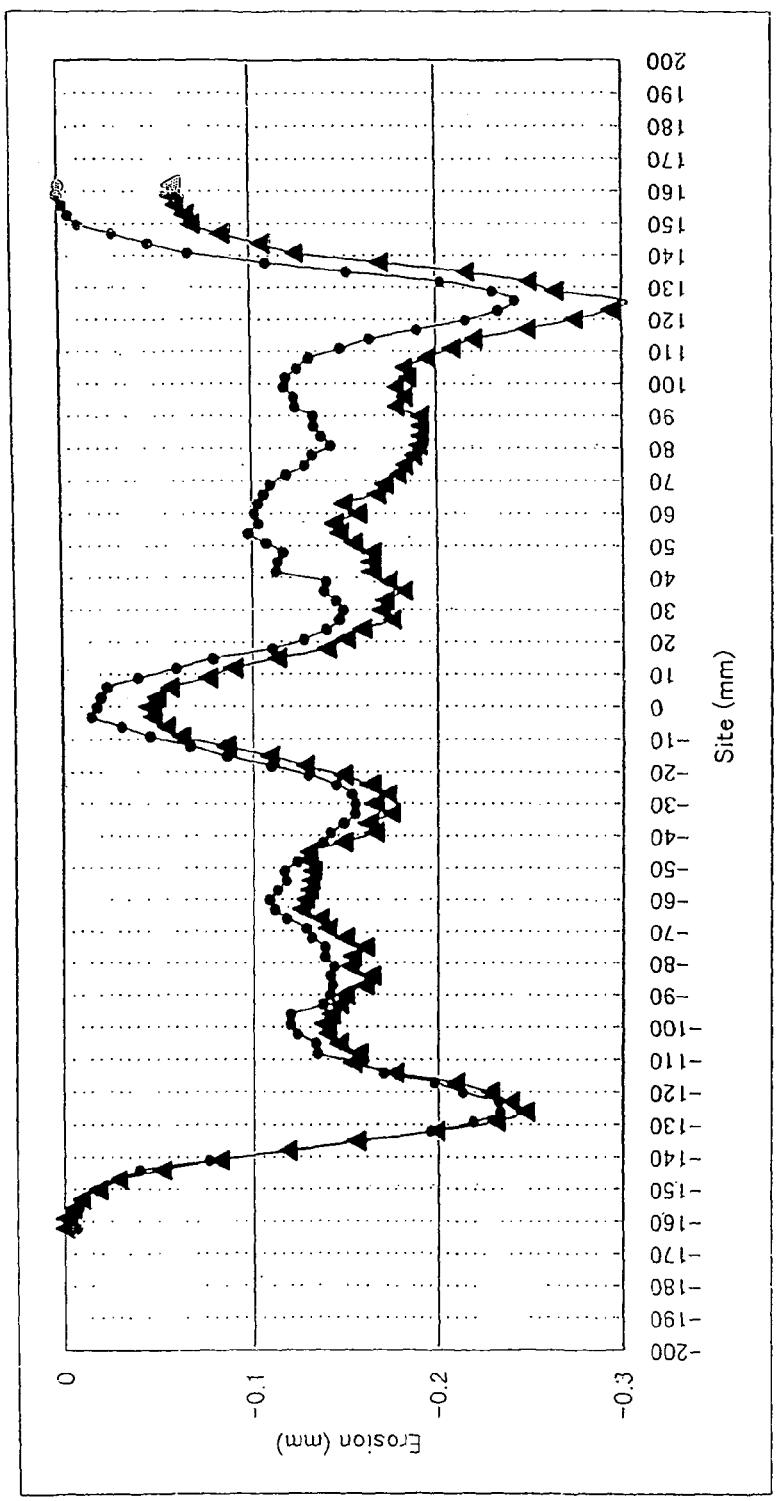
FIG. 5 is a drawing showing the erosion profile of the tantalum target of Example 1 and Comparative Example 3.

FIG. 5 shows an erosion profile (● points), and this standard and typical erosion profile is characterized in that the performance of the target is also favorable.

TABLE 1

|  | Example 1 | Example 2 | Example 3 | Example 4 | Example 5 | Example 6 |
|---|---|---|---|---|---|---|
| Purity | 99.997% | 99.997% | 99.997% | 99.997% | 99.95% | 99.997% |
| Final heat treatment temperature | 1073 K (800° C.) | 973 K (700° C.) | 1048 K (775° C.) | 1098 K (825° C.) | 1173 K (900° C.) | — (as roll) |
| Vickers hardness: Hv | 130~171 | 172~180 | 147~152 | 92~123 | 180~190 | 173~185 |
| Non-crystallized % | 約80% | 約90% | 約85% | 約25% | 約80% | 100% |
| Average grain diameter (μm) | — | — | — | — | — | — |
| Uniformity, Transition(1σ) of sheet resistance in 8 inch Wafer (Initial stage of sputtering) | 3.3% | 3.5% | 3.4% | 3.8% | 4.1% | 3.1% |
| (Middle stage of sputtering) | 3.1% | 3.6% | 3.3% | 3.6% | 4.0% | 3.6% |
| (Final stage of sputtering) | 3.2% | 3.4% | 3.3% | 3.6% | 3.8% | 3.2% |

|  | Comparative Ex. 1 | Comparative Ex. 2 | Comparative Ex. 3 |
|---|---|---|---|
| Purity | 99.997% | 99.997% | 99.997% |
| Final heat treatment temperature | 1173 K (900° C.) | 1317 K (1100° C.) | 1123 K (850° C.) |
| Vickers hardness: Hv | 70~85 | 71~76 | 72~85 |
| Non-crystallized % | — | — | — |
| Average grain diameter(μm) | 55 μm | 96 μm | 37 μm |
| Uniformity, Transition (1σ) of sheet resistance in 8 inch Wafer (Initial stage of sputtering) | 4.5% | 4.7% | 4.1% |
| (Middle stage of sputtering) | 5.5% | 5.3% | 3.9% |
| (Final stage of sputtering) | 5.1% | 5.2% | 4.5% |

Vickers hardenss was mesured at 20 points in the thickness direction.

Example 2

A tantalum raw material having a purity of 99.997% was subject to electron beam melting, and this was cast to prepare an ingot or billet having a thickness of 200 mm and diameter of 200 mm ϕ. The crystal grain diameter in this case was approximately 50 mm. Next, after performing cold extend forging to this ingot or billet at room temperature, this was subject to recrystallization annealing at a temperature of 1500K. As a result, a material having a structure in which the average crystal grain diameter is 200 mm, thickness of 100 mm, and diameter of 100 mm ϕ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm ϕ was obtained.

Next, this was subject to cold extend forging and upset forging, and recrystallization annealing at 1173K, subsequently subject to cold rolling once again, and recrystallization annealing at 973K thereafter as well as finish processing, so as to obtain a target material having a thickness of 10 mm and diameter of 320 mm ϕ.

As a result of performing the foregoing process, it was possible to obtain a tantalum target having a non-recrystallized structure of roughly 90% and which has a Vickers hardness Hv of 172 to 180. Further, the micrograph of this tantalum target obtained in Example 2 had the same crystal structure as the tantalum target shown in FIG. 1 and FIG. 2. The results are shown in Table 1 as with Example 1.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

As evident from Table 1, in Example 2, variation in the resistance distribution within the sheet from the initial stage of sputtering to the final stage of sputtering was small (3.4 to 3.6%); that is, variation in the film thickness distribution was small.

As a result of performing sputtering with this target, this target had a high deposition speed, favorable film uniformity, little variation in the film thickness with an 8-inch wafer, and no generation of arcings or particles, and was therefore capable of improving the quality of sputtering deposition. The performance of the target was also favorable as with Example 1.

Example 3

A tantalum raw material having a purity of 99.997% was subject to electron beam melting, and this was cast to prepare an ingot or billet having a thickness of 200 mm and diameter of 300 mm ϕ. The crystal grain diameter in this case was approximately 50 mm. Next, after performing cold extend forging to this ingot or billet at room temperature, this was subject to recrystallization annealing at a temperature of 1500K. As a result, a material having a structure in which the average crystal grain diameter is 250 μm, thickness of 100 mm, and diameter of 100 mm ϕ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm ϕ was obtained.

Next, this was subject to cold mix forging and recrystallization annealing at 1173K, subsequently subject to cold rolling once again and recrystallization annealing at 1048K thereafter, as well as finish processing, so as to obtain a target material having a thickness of 10 mm and diameter of 320 mm ϕ.

As a result of performing the foregoing process, it was possible to obtain a tantalum target having a non-recrystallized structure of roughly 85% and which has a Vickers hardness Hv of 147 to 152. Further, the micrograph of this tantalum target obtained in Example 3 had the same crystal structure as the tantalum target shown in FIG. 1 and FIG. 2. The results are shown in Table 1 as with Example 1.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

As evident from Table 1, in Example 3, variation in the resistance distribution within the sheet from the initial stage of sputtering to the final stage of sputtering was small (3.4 to 3.3%); that is, variation in the film thickness distribution was small.

As a result of performing sputtering with this target, this target had a high deposition speed, favorable film uniformity, little variation in the film thickness with an 8-inch wafer, and no generation of arcings or particles, and was therefore capable of improving the quality of sputtering deposition. The performance of the target was also favorable as with Example 1.

Example 4

A tantalum raw material having a purity of 99.997% was subject to electron beam melting, and this was cast to prepare an ingot or billet having a thickness of 200 mm and diameter of 300 mm φ. The crystal grain diameter in this case was approximately 50 mm. Next, after performing cold extend forging to this ingot or billet at room temperature, this was subject to recrystallization annealing at a temperature of 1500K. As a result, a material having a structure in which the average crystal grain diameter is 250 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold mix forging and recrystallization annealing at 1173K, subsequently subject to cold rolling and recrystallization annealing at 1098K thereafter, as well as finish processing, so as to obtain a target material having a thickness of 10 mm and diameter of 320 mm φ.

As a result of performing the foregoing process, it was possible to obtain a tantalum target having a non-recrystallized structure of roughly 25% and which has a Vickers hardness Hv of 92 to 123. Further, the micrograph of this tantalum target obtained in Example 4 had the same crystal structure as the tantalum target shown in FIG. 1 and FIG. 2. The results are shown in Table 1 as with Example 1.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

As evident from Table 1, in Example 4, variation in the resistance distribution within the sheet from the initial stage of sputtering to the final stage of sputtering was small (3.6 to 3.8%); that is, variation in the film thickness distribution was small.

As a result of performing sputtering with this target, this target had a high deposition speed, favorable film uniformity, little variation in the film thickness with an 8-inch wafer, and no generation of arcings or particles, and was therefore capable of improving the quality of sputtering deposition. The performance of the target was also favorable as with Example 1.

Example 5

A tantalum raw material having a purity of 99.95% was subject to electron beam melting, and this was cast to prepare an ingot or billet having a thickness of 200 mm and diameter of 300 mm φ. The crystal grain diameter in this case was approximately 50 mm. Next, after performing cold extend forging to this ingot or billet at room temperature, this was subject to recrystallization annealing at a temperature of 1500K. As a result, a material having a structure in which the average crystal grain diameter is 250 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold mix forging and recrystallization annealing at 1173K, subsequently subject to cold rolling and stress relief annealing at 1173K thereafter, as well as finish processing, so as to obtain a target material having a thickness of 10 mm and diameter of 320 mm φ.

As a result of performing the foregoing process, it was possible to obtain a tantalum target having a non-recrystallized structure of roughly 80% and which has a Vickers hardness Hv of 180 to 190. Further, the micrograph of this tantalum target obtained in Example 5 had the same crystal structure as the tantalum target shown in FIG. 1 and FIG. 2. The results are shown in Table 1 as with Example 1.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

As evident from Table 1, in Example 5, variation in the resistance distribution within the sheet from the initial stage of sputtering to the final stage of sputtering was small (3.8 to 4.1%); that is, variation in the film thickness distribution was small.

As a result of performing sputtering with this target, this target had a high deposition speed, favorable film uniformity, little variation in the film thickness with an 8-inch wafer, and no generation of arcings or particles, and was therefore capable of improving the quality of sputtering deposition. The performance of the target was also favorable as with Example 1.

Example 6

A tantalum raw material having a purity of 99.997% was subject to electron beam melting, and this was cast to prepare an ingot or billet having a thickness of 200 mm and diameter of 300 mm φ. The crystal grain diameter in this case was approximately 50 mm. Next, after performing cold extend forging to this ingot or billet at room temperature, this was subject to recrystallization annealing at a temperature of 1500K. As a result, a material having a structure in which the average crystal grain diameter is 200 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold mix forging and recrystallization annealing at 1173K, subsequently subject to cold rolling and finish processing without performing stress relief annealing thereafter, so as to obtain a target material ultimately subject to cold rolling and having a thickness of 10 mm and diameter of 320 mm φ.

As a result of performing the foregoing process, it was possible to obtain a tantalum target naturally having a non-recrystallized structure of roughly 100% and which has a Vickers hardness Hv of 173 to 185. Further, the micrograph of this tantalum target obtained in Example 6 had the same crystal structure as the tantalum target shown in FIG. 1 and FIG. 2. The results are shown in Table 1 as with Example 1.

Incidentally, since the sheet resistance depends on the film thickness, distribution of the sheet resistance within the wafer (8 inch) was measured, and the status of film thickness distribution was examined thereby. Specifically, the sheet resistance at 49 points on the wafer was measured, and the standard deviation (σ) was calculated.

As evident from Table 1, in Example 6, variation in the resistance distribution within the sheet from the initial stage of sputtering to the final stage of sputtering was small (3.1 to 3.6%); that is, variation in the film thickness distribution was small.

As a result of performing sputtering with this target, this target had a high deposition speed, favorable film uniformity, little variation in the film thickness with an 8-inch wafer, and no generation of arcings or particles, and was therefore capable of improving the quality of sputtering deposition. The performance of the target was also favorable as with Example 1.

Comparative Example 1

As with Example 1, a tantalum raw material having a purity of 99.997% was subject to electron beam melting, and this was cast to prepare an ingot or billet having a thickness of 200 mm and diameter of 200 mm φ. The crystal grain diameter in this case was approximately 55 mm. Next, after performing extend forging and upset forging to this ingot or billet at room temperature, this was subject to recrystallization annealing at a temperature of 1173K. As a result, a material having a structure in which the average crystal grain diameter is 180 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold mix forging and recrystallization annealing at 1173K, as well as finish processing, so as to obtain a target material having a thickness of 10 mm and diameter of 320 mm φ.

Numerous traces in the form of wrinkles were observed from the center to the periphery of the tantalum target obtained with the foregoing process, and the result was a tantalum target having a hetero-phase crystal structure. Further, the micrograph of the tantalum target obtained in Comparative Example 1 had the same crystal structure as the tantalum target shown in FIG. 3.

With the tantalum target obtained with the foregoing process, the average crystal grain size was large at 55 μm and varied, and the orientation was roughly uniform from the target surface to the center portion thereof. The Vickers hardness Hv was 70 to 85, and the strength was weak.

When performing sputtering with this tantalum target, evenness (uniformity) of the film was inferior, and caused the quality of sputter deposition to deteriorate. The results are similarly shown in Table 1.

The results shown in Comparative Example 1 of Table 1 were obtained by measuring the sheet resistance at 49 points on the wafer (8 inch) as with Example 1, and calculating the standard deviation (σ) thereof. In Comparative Example 1, variation in the resistance distribution within the sheet from the initial stage of sputtering to the final stage of sputtering was large (4.5 to 5.5%); that is, variation in the film thickness distribution was significant.

Further, variation in the film thickness in an 8-inch wafer was significant, arcings and particles were generated, and this caused the quality of the sputtering deposition to deteriorate.

Comparative Example 2

As with Example 1, a tantalum raw material having a purity of 99.997% was subject to electron beam melting, and this was cast to prepare an ingot or billet having a thickness of 200 mm and diameter of 200 mm φ. The crystal grain diameter in this case was approximately 55 mm. Next, after performing cold mix forging to this ingot or billet at room temperature, this was subject to recrystallization annealing at a temperature of 1173K. As a result, a material having a structure in which the average crystal grain diameter is 180 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold rolling and recrystallization annealing at 1373K, as well as finish processing, so as to obtain a target material having a thickness of 10 mm and diameter of 320 mm φ.

The tantalum target obtained with the foregoing process had coarsened crystals. Further, the micrograph of the tantalum target obtained in Comparative Example 2 had the same crystal structure as the tantalum target shown in FIG. 3 and FIG. 4.

With the tantalum target obtained with the foregoing process, the average crystal grain size was large at 96 μm and varied, and the orientation was roughly uniform from the target surface to the center portion thereof. The Vickers hardness Hv was 71 to 76, and the strength was weak.

When performing sputtering with this tantalum target, evenness (uniformity) of the film was inferior, and caused the quality of sputter deposition to deteriorate. The results are similarly shown in Table 1.

The results shown in Comparative Example 2 of Table 1 were obtained by measuring the sheet resistance at 49 points on the wafer (8 inch) as with Example 1, and calculating the standard deviation (σ) thereof. In Comparative Example 2, variation in the resistance distribution within the sheet from the initial stage of sputtering to the final stage of sputtering was large (4.7 to 5.3%); that is, variation in the film thickness distribution was significant.

Further, with this tantalum target, evenness (uniformity) of the film was inferior, variation in the film thickness in an 8-inch wafer was significant, arcings and particles were generated, and this caused the quality of the sputtering deposition to deteriorate.

Comparative Example 3

As with Example 1, a tantalum raw material having a purity of 99.997% was subject to electron beam melting, and this was cast to prepare an ingot or billet having a thickness of 200 mm and diameter of 200 mm φ. The crystal grain diameter in this case was approximately 55 mm. Next, after performing cold mix forging to this ingot or billet at room temperature, this was subject to recrystallization annealing at a temperature of 1173K. As a result, a material having a structure in which the average crystal grain diameter is 180 μm, thickness of 100 mm, and diameter of 100 mm φ was obtained.

Next, this was subject to extend forging and upset forging at room temperature once again, and recrystallization annealing was performed thereto again at a temperature of 1173K. As a result, a material having a structure in which the average crystal grain diameter is 80 μm, thickness of 100 mm, and diameter of 100 mm φ was obtained.

Next, this was subject to cold mix forging and recrystallization annealing at 1123K, as well as finish processing, so as to obtain a target material having a thickness of 10 mm and diameter of 320 mm φ.

The tantalum target obtained with the foregoing process had coarsened crystals. Further, the micrograph of the tantalum target obtained in Comparative Example 3 had the same crystal structure as the tantalum target shown in FIG. 3 and FIG. 4.

With the tantalum target obtained with the foregoing process, the average crystal grain size was large at 37 μm and varied, and the orientation was roughly uniform from the target surface to the center portion thereof. The Vickers hardness Hv was 72 to 85, and the strength was weak.

When performing sputtering with this tantalum target, evenness (uniformity) of the film was inferior, and caused the quality of sputter deposition to deteriorate. The results are similarly shown in Table 1.

However, with respect to this target, as shown with the erosion profile (▲ points) in FIG. 5, the performance was inferior in comparison to the Examples.

The results shown in Comparative Example 3 of Table 1 were obtained by measuring the sheet resistance at 49 points on the wafer (8 inch) as with Example 1, and calculating the standard deviation (σ) thereof.

In Comparative Example 3, variation in the resistance distribution within the sheet from the initial stage of sputtering to the final stage of sputtering was large (3.9 to 4.5%); that is, variation in the film thickness distribution was significant.

Further, with this tantalum target, evenness (uniformity) of the film was inferior, variation in the film thickness in an 8-inch wafer was significant, arcings and particles were generated, and this caused the quality of the sputtering deposition to deteriorate.

The present invention provides a tantalum target comprising a non-recrystallized structure without any coarsened abnormal crystals caused by the conventional recrystallization annealing or hetero-phase crystal grains aggregated in the form of wrinkles, and yields a superior effect in that it is capable of stably obtaining a tantalum sputtering target having a high deposition speed and excellent uniformity of film, producing less arcings and particles and having excellent film forming properties by performing plastic working such as forging and rolling and heat treatment, thereafter performing cold plastic working such as cold rolling, and performing annealing after such plastic working or final processing.

The invention claimed is:

1. A tantalum sputtering target manufactured by subjecting a molten and cast tantalum ingot or billet to forging, annealing and rolling, said tantalum sputtering target having a non-recrystallized structure, wherein the non-recrystallized structure is 20% or more.

2. A tantalum sputtering target according to claim 1, wherein the non-recrystallized structure is more than 20%.

3. A tantalum sputtering target according to claim 1, wherein said tantalum sputtering target has a Vickers hardness of 90 or more.

4. A tantalum sputtering target according to claim 1, wherein said tantalum sputtering target is made of high purity tantalum having a purity of 4N5 (99.995%) or more.

5. A tantalum sputtering target manufactured by subjecting a molten and cast tantalum ingot or billet to forging, annealing and rolling, said tantalum sputtering target having a non-recrystallized structure, wherein the non-recrystallized structure is 40% or more.

6. A tantalum sputtering target according to claim 3, wherein said tantalum sputtering target has a Vickers hardness of 90 or more.

7. A tantalum sputtering target according to claim 5, wherein said tantalum sputtering target has a Vickers hardness of 100 or more.

8. A tantalum sputtering target according to claim 5, wherein said tantalum sputtering target has a Vickers hardness of 125 or more.

9. A method of manufacturing a tantalum sputtering target comprising the steps of subjecting a molten and cast tantalum ingot or billet to forging, annealing and rolling processes, and performing plastic working on said ingot or billet, and thereafter annealing the ingot or billet at a temperature of 1173K or less to provide the tantalum sputtering target with a non-recrystallized structure.

10. The method according to claim 9, wherein said ingot or billet is subjected to finish processing to form a target shape.

11. The method according to claim 9, wherein, during said step of subjecting the molten and cast tantalum ingot or billet to forging, annealing and rolling processes, the annealing is recrystallization annealing, and wherein said forging and recrystallization annealing processes are repeated two or more times.

12. The method according to claim 9, wherein extend forging and upset forging are repeatedly performed on the ingot or billet.

13. The method according to claim 9, wherein, during said step of subjecting the molten and cast tantalum ingot or billet to forging, annealing and rolling processes, the annealing is recrystallization annealing, and wherein said recrystallization annealing is performed at a temperature of between a recrystallization temperature of the ingot or billet and 1673K.

14. A method of manufacturing a tantalum sputtering target comprising the steps of subjecting a molten and cast tantalum ingot or billet made of a tantalum raw material having a purity of 4N5 (99.995%) or more to forging, annealing and rolling, performing a plastic working process on the ingot or billet, and thereafter annealing the ingot or billet at a temperature of 1173K or less to provide the tantalum sputtering target with a non-recrystallized structure.

15. The method according to claim 14, wherein, after said plastic working process or after said step of annealing at 1173K or less, said ingot or billet is subjected to finish processing to form a target shape.

16. The method according to claim 15, wherein during said step of subjecting the molten and cast tantalum ingot or billet to forging, annealing and rolling, said annealing is recrystallization annealing, and said forging and recrystallization annealing processes are repeated two or more times.

17. The method according to claim 16, wherein extend forging and upset forging are repeatedly performed on the ingot or billet.

18. The method according to claim 17, wherein said recrystallization annealing is performed at a temperature of between a recrystallization temperature of the ingot or billet and 1673K.

19. The method according to claim 14, wherein during said step of subjecting the molten and cast tantalum ingot or billet to forging, annealing and rolling, said annealing is recrystallization annealing, and said forging and recrystallization annealing processes are repeated two or more times.

20. The method according to claim 14, wherein extend forging and upset forging are repeatedly performed on the ingot or billet.

21. The method according to claim 14, wherein during said step of subjecting the molten and cast tantalum ingot or billet to forging, annealing and rolling, said annealing is recrystallization annealing performed at a temperature of between a recrystallization temperature of the ingot or billet and 1673K.

22. The method according to claim 14, wherein said temperature is selected from the group consisting of 973K, 1048K, and 1073K.

23. The method according to claim 14, wherein said temperature is 973K to 1073K.

* * * * *

UNITED STATES PATENT AND TRADEMARK OFFICE
CERTIFICATE OF CORRECTION

PATENT NO. : 8,172,960 B2
APPLICATION NO. : 10/551732
DATED : May 8, 2012
INVENTOR(S) : Kunihiro Oda et al.

It is certified that error appears in the above-identified patent and that said Letters Patent is hereby corrected as shown below:

Column 6, line 16 "obtained" should read "was obtained".

Column 7, line 40 "200 mm" should read "200 μm".

Signed and Sealed this
Thirty-first Day of July, 2012

David J. Kappos
*Director of the United States Patent and Trademark Office*